(12) United States Patent
Lee et al.

(10) Patent No.: US 6,521,523 B2
(45) Date of Patent: Feb. 18, 2003

(54) METHOD FOR FORMING SELECTIVE PROTECTION LAYERS ON COPPER INTERCONNECTS

(75) Inventors: Shyh-Dar Lee, Hsinchu Hsien (TW); Chen-Chiu Hsue, Hsinchu (TW)

(73) Assignee: Silicon Integrated Systems Corp., Hsin Chu (TW)

(*) Notice: Subject to any disclaimer, the term of this patent is extended or adjusted under 35 U.S.C. 154(b) by 47 days.

(21) Appl. No.: 09/881,103

(22) Filed: Jun. 15, 2001

(65) Prior Publication Data

US 2002/0192940 A1 Dec. 19, 2002

(51) Int. Cl.[7] .................................. H01L 21/4763
(52) U.S. Cl. .................... 438/633; 438/628; 438/644; 438/654; 438/687; 438/692; 438/759
(58) Field of Search ..................... 438/687, 628, 438/831, 833, 643, 644, 653, 654, 692, 693, 759

(56) References Cited

U.S. PATENT DOCUMENTS

| 5,354,712 A | * 10/1994 | Ho et al. ............... 438/643 |
| 5,403,779 A | 4/1995 | Joshi et al. |
| 5,447,887 A | 9/1995 | Filipiak et al. |
| 5,814,557 A | 9/1998 | Venkatraman et al. |
| 6,251,150 B1 | * 6/2001 | Small et al. ............... 106/3 |
| 6,342,166 B1 | * 1/2002 | Ide et al. ............... 216/22 |
| 6,383,928 B1 | * 5/2002 | Eissa ............... 438/633 |
| 2001/0046721 A1 | * 11/2001 | Stierman et al. ............... 438/14 |
| 2002/0077035 A1 | * 6/2002 | Wang et al. ............... 451/41 |

* cited by examiner

Primary Examiner—Eddie Lee
Assistant Examiner—N. Drew Richards
(74) Attorney, Agent, or Firm—Birch, Stewart, Kolasch & Birch, LLP

(57) ABSTRACT

Disclosed is a method for forming selective protection layers on copper interconnects in a damascene process. A copper layer is deposited overlying a dielectric layer and filling interconnect trenches which are previously formed in the dielectric layer. The excess copper layer is polished by a chemical mechanical polishing process with a slurry comprising an aluminum organic substance. The aluminum organic substance reacts with copper via annealing to selectively form aluminum-copper alloys on the copper interconnects. The aluminum-copper alloys are then oxidized to form aluminum oxide protection layers capping the copper interconnects.

31 Claims, 5 Drawing Sheets

METHOD FOR FORMING SELECTIVE PROTECTION LAYERS ON COPPER INTERCONNECTS

BACKGROUND OF THE INVENTION

1. Field of the Invention

The present invention relates to the fabrication of semiconductor structures, and more particularly, to a method for forming selective protection layers over copper interconnects in the manufacture of integrated circuits.

2. Description of the Related Arts

As integrated circuit feature sizes continue to decrease, it has become advantageous to construct metal connections out of copper instead of aluminum. Copper has a lower resistivity than aluminum, and therefore can form higher speed connections for a given line width.

Copper has disadvantages when compared to aluminum that must be overcome. For example, copper is much more susceptible to oxidation during processing. Copper also tends to diffuse into adjacent materials, including dielectrics. To use copper for interconnections, therefore, it is necessary to encapsulate the copper in barrier materials.

Where a low resistive interface between a copper interconnect and an underlying metal conductor must be completed, it is common in the art to deposit a barrier of a metal material, such as titanium, tungsten, tantalum, or tantalum nitride before the copper layer is deposited.

After the copper layer is deposited, another barrier layer, typically called a sealing layer is deposited overlying the copper. Typically in the art, this sealing layer (also called a cap layer, or an encapsulation layer) is composed of silicon nitride, though other materials are used.

Referring to FIG. 1, a cross-section of a prior art damascene wiring is shown. A dielectric layer 102 and a substrate 100 are depicted. The substrate 100 encompasses all underlying layers, devices, junctions, and other features that have been formed prior to the deposition of dielectric layer 102.

Interconnection trenches are formed in the dielectric layer 102, and a barrier layer 104 is deposited overlying the dielectric layer 102 and in the trenches. The purpose of the barrier layer 104 is to prevent diffusion of the subsequently deposited copper. A copper layer 106 has been deposited overlying the dielectric layer 102 and filling the trenches. The excess copper layer 106 and the excess barrier layer 104 are then typically polished down to the dielectric layer 102 by a chemical mechanical polishing (CMP) process.

Following the definition of the copper interconnects 106 by the CMP, a sealing layer 108 is deposited. This sealing layer 108 serves as a barrier to diffusion of the copper layer 106 into any overlying layers. In addition, by encapsulating the copper completely in the barrier layer 104 and the sealing layer 108, oxidation during subsequent processes is eliminated.

The sealing layer 108 is typically silicon nitride. Due to the need for low temperature processing after the copper is deposited, the silicon nitride layer 108 cannot be deposited at temperatures in excess of 450° C. Accordingly, silicon-nitride deposition is typically performed using plasma enhanced chemical vapor deposition (PECVD) where temperatures generally range from 200° C. to 425° C. PECVD silicon-nitride has been used in other applications in semiconductor devices. However, in using a silicon nitride cap for copper interconnects, conventional PECVD silicon nitride creates reliability problems. In particular, silicon nitride films deposited using conventional PECVD processes have poor adhesion to copper surfaces. As an example, some nitride films can be peeled from the copper surfaces simply by scratching the film or by removing the film using an adhesive tape. These results are indicative of how the silicon nitride film might adhere to the copper in an actual fabrication process. After being deposited onto the copper surface, additional insulating layers will be deposited over the silicon nitride film. However, subsequent deposition of insulating layers onto the nitride film will produce stresses which can cause the silicon nitride layer to peel from the copper surface. Despite that other layers have been deposited onto the semiconductor device, the peeling of the silicon nitride film creates a path for copper to diffuse outward and for moisture or other contaminates to diffuse inward.

Several prior art approaches deal with copper sealing methods. U.S. Pat. No. 5,403,779 to Joshi et al teaches a process to form damascene metal lines and vias. After copper deposition, tungsten is deposited by CVD. A CMP step is performed to planarize the structures. U.S. Pat. No. 5,447,887 to Filipiak et al discloses a process to form copper interconnects where a copper silicide layer is formed overlying the copper traces. A silicon nitride layer is deposited overlying the copper silicide to complete the encapsulation layer. U.S. Pat. No. 5,814,557 to Venkatraman et al discloses a process to form a copper-containing aluminum film overlying an aluminum conductor. An annealing operation is performed to diffuse the copper into the aluminum conductor.

SUMMARY OF THE INVENTION

An object of the invention is to provide a process for implementing copper damascene wiring within an integrated circuit.

A further object of the invention is to provide a method of fabricating copper interconnects with selective protection layers that are selectively formed only overlying the copper interconnects.

A still further object of the invention is to provide a method of fabricating copper interconnects with selective sealing layers that effectively prevent copper oxidation and diffusion.

A yet further object of the invention is to provide a method of fabricating copper interconnects with selective adhesion layers that increase the adhesion between the nitride and copper.

The above and other objects are achieved by polishing the excess copper layer with a slurry comprising an aluminum organic substance. The aluminum organic substance reacts with copper via annealing to selectively form aluminum-copper alloys on the copper interconnects. The aluminum-copper alloys are then oxidized to form aluminum oxide protection layers capping the copper interconnects. The aluminum oxide protection layers can function as a conventional sealing layer to prevent copper diffusion and oxidation, or they can function as an adhesion layer to improve the adhesion between the copper interconnects and a later sealing layer.

According to one aspect of this invention, there is provided a method for making copper interconnects in the fabrication of a semiconductor device comprising the steps of providing a semiconductor substrate; forming a dielectric layer overlying the substrate, the dielectric layer having interconnect trenches formed therein; depositing a copper layer overlying the dielectric layer and filling the interconnect trenches; chemical-mechanical polishing the copper layer to the top surface of the dielectric layer and thereby defining copper interconnects, said polishing leaving an aluminum organic substance on said copper interconnects which can react with copper via annealing to form an aluminum-copper alloy; annealing the substrate to form aluminum-copper alloys overlying said copper interconnects; and oxidizing the aluminum-copper alloys to form aluminum oxide protection layers capping said copper interconnects.

According to another aspect of this invention, there is provided a method for making copper interconnects in the fabrication of a semiconductor device comprising the steps of providing a semiconductor substrate; forming a dielectric layer overlying the substrate, the dielectric layer having interconnect trenches formed therein; depositing a copper layer overlying the dielectric layer and filling the interconnect trenches; first chemical-mechanical polishing the copper layer with a first slurry to remove most of the copper layer overlying the dielectric layer; second chemical-mechanical polishing the copper layer with a second slurry to the top surface of the dielectric layer and thereby defining copper interconnects, said second slurry comprising an aluminum organic substance which can react with copper via annealing to form an aluminum-copper alloy, and said polishing leaving said aluminum organic substance on said dielectric layer and said copper interconnects; annealing the substrate to form aluminum-copper alloys overlying said copper interconnects; and treating the substrate with an inorganic acid solution to selectively remove non-reacted aluminum organic substance from said dielectric layer and to oxidize the aluminum-copper alloys to form aluminum oxide protection layers capping said copper interconnects.

According to still another aspect of this invention, there is provided a method for making copper interconnects in the fabrication of a semiconductor device comprising the steps of providing a semiconductor substrate; forming a dielectric layer overlying the substrate, the dielectric layer having interconnect trenches formed therein; depositing a barrier layer lining said interconnect trenches and overlying said dielectric layer; depositing a copper layer overlying the barrier layer and filling the interconnect trenches; first chemical-mechanical polishing the copper layer with a first slurry to remove most of the copper layer overlying the dielectric layer; second chemical-mechanical polishing the copper layer and the barrier layer with a second slurry to the top surface of the dielectric layer and thereby defining copper interconnects, said second slurry comprising an aluminum organic substance which can react with copper via annealing to form an aluminum-copper alloy, and said polishing leaving said aluminum organic substance on said dielectric layer and said copper interconnects; baking the substrate at a first temperature; annealing the substrate at a second temperature higher than the first temperature to form aluminum-copper alloys capping said copper interconnects; and treating the substrate with an inorganic acid solution to selectively remove non-reacted aluminum organic substance from said dielectric layer and to oxidize the aluminum-copper alloys to form aluminum oxide cap layers overlying said copper interconnects.

BRIEF DESCRIPTION OF THE DRAWINGS

The above and other objects, features, and advantages of the present invention will become apparent from the following detailed description of preferred embodiments of the invention explained with reference to the accompanying drawings, in which.

DESCRIPTION OF THE PREFERRED EMBODIMENTS

Figure 1:
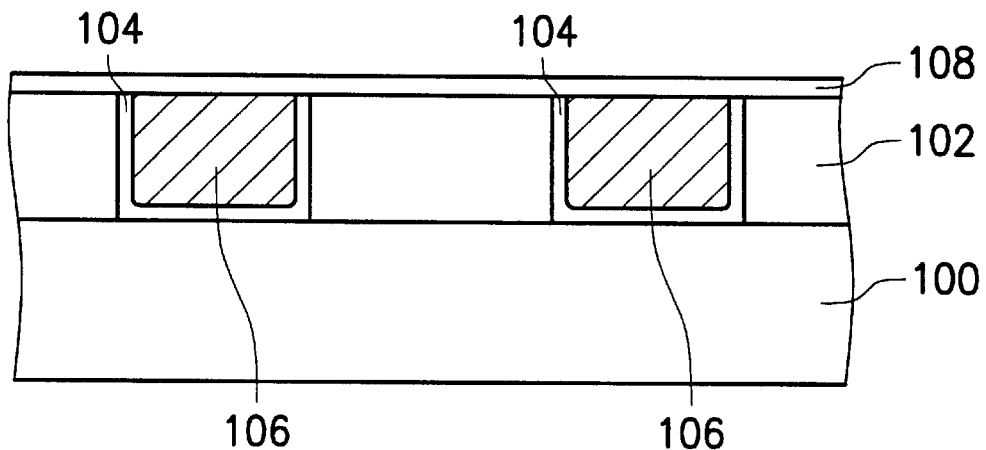
FIG. 1 is a cross-sectional view illustrating a prior art damascene wiring.
Figure 2:
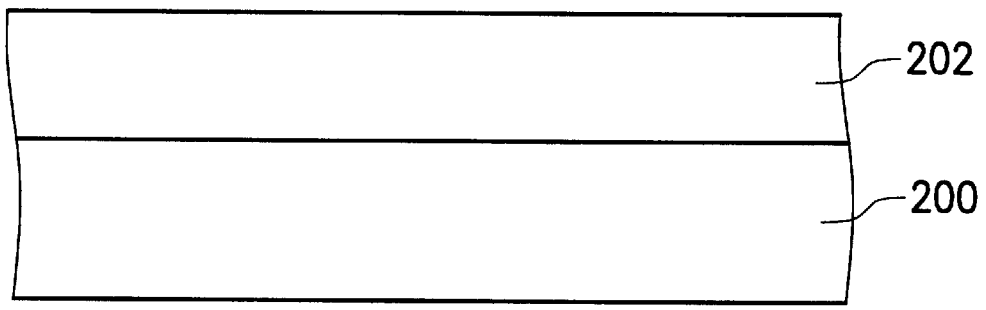
FIGS. 2–10 are cross-sectional views illustrating the steps for fabricating copper interconnects according to preferred embodiments of the invention.

Preferred embodiments of the present invention are now described with reference to FIGS. 2–10. FIG. 2 shows a cross-sectional view of a semiconductor substrate 200 having a number of layer deposited thereon for the formation of wiring lines. The substrate may contain a variety of elements, including, for example, transistors, diodes, and other semiconductor elements (not shown) as are well known in the art. The substrate 200 may also contain other metal interconnect layers. A first intermetal dielectric (IMD) layer 202 is deposited overlying the substrate 200 where the damascene structure is to be formed. The first intermetal dielectric layer 202 may consist of one or more commonly used dielectric materials in semiconductor processing. For example, the first intermetal dielectric layer 202 may be silicon dioxide, borophosphosilicate glass (BPSG), phosphosilicate glass (PSG), or low-k materials such as fluorosilicate glass (FSG). Preferably, the first intermetal dielectric layer 202 is deposited to a thickness ranging from about 4,000 Å to 10,000 Å.

Figure 3:
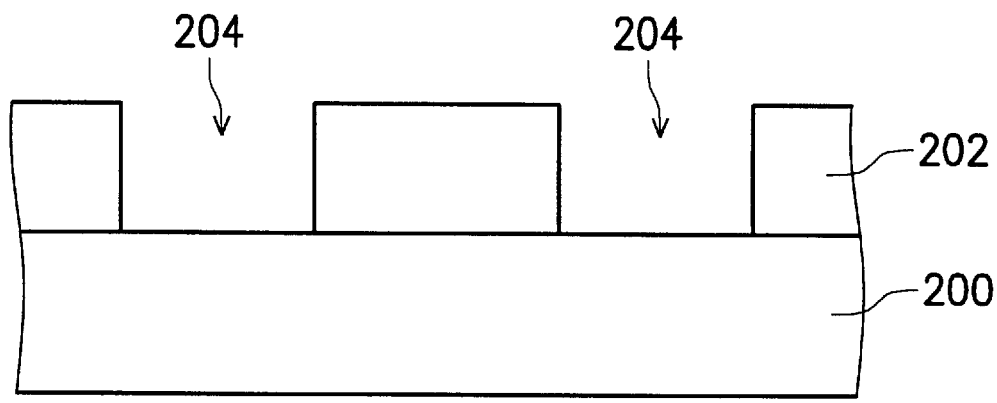

Referring to FIG. 3, the first intermetal dielectric layer 202 is etched through a photoresist mask which is not shown. This etching step forms interconnect trenches 204 in the first intermetal dielectric layer 202. The interconnect trenches are etched by a conventional reactive ion etch (RIE). In this embodiment, the present invention will be used to create selective protection layers on copper interconnects in a single damascene process. It will be understood by those skilled in the art that the invention could be applied to a dual damascene process. In such cases, interconnect holes are formed inside the interconnect trenches 204 for contact between the interconnects and some other layer.

Figure 4:
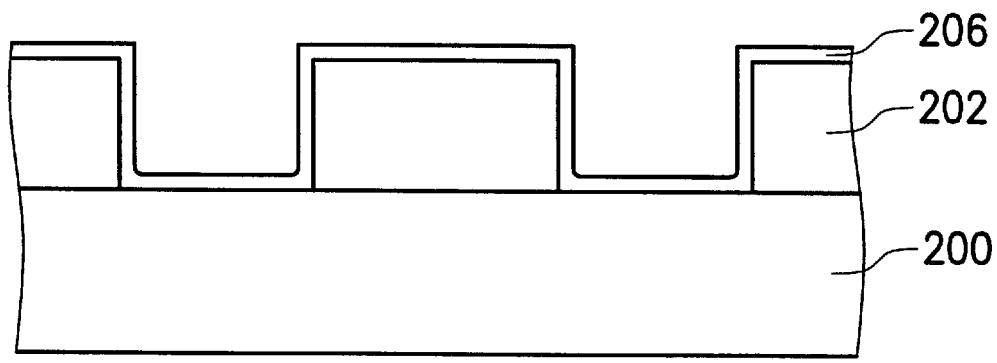

Referring now to FIG. 4, a barrier layer 206 is deposited overlying the first intermetal dielectric layer 202 and lining the interconnect trenches 204. The purpose of the barrier layer 206 is to prevent oxidation and diffusion of the subsequently deposited copper metal layer. The barrier layer 206 may be composed of any of several metals such as tantalum (Ta), titanium (Ti), or tungsten (w), or nitrides such as titanium nitride (TiN), tantalum nitride (TaN), and tungsten nitride (WN). The barrier layer 206 is deposited to a thickness ranging from about 100 Å to 500 Å.

Figure 5:
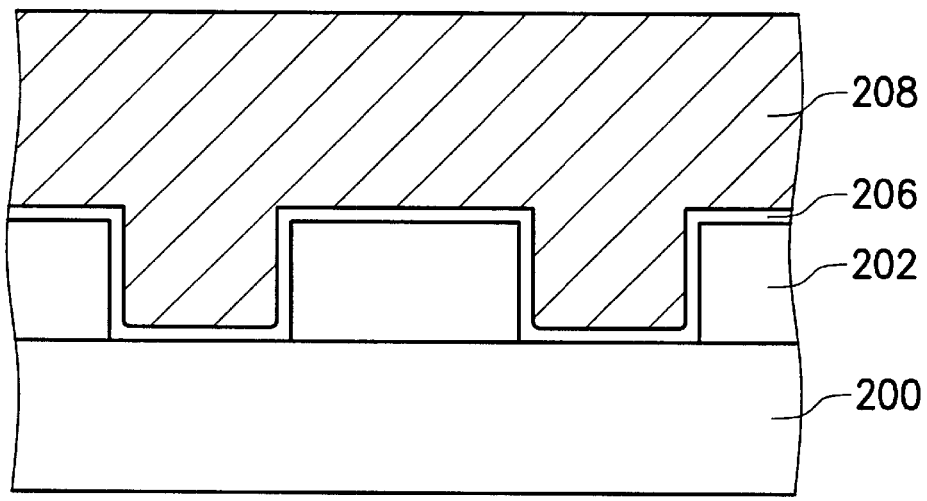

Referring to FIG. 5, a copper layer 208 is deposited overlying the barrier layer 206 and filling the interconnect trenches 204. Typically, a seed layer is first deposited using physical vapor deposition (PVD) or chemical vapor deposition (CVD). Then the copper layer 208 is deposited by electrochemical plating over the seed layer. The copper layer 208 is deposited to a thickness ranging from about 5,000 Å to 15,000 Å.

Figure 6:
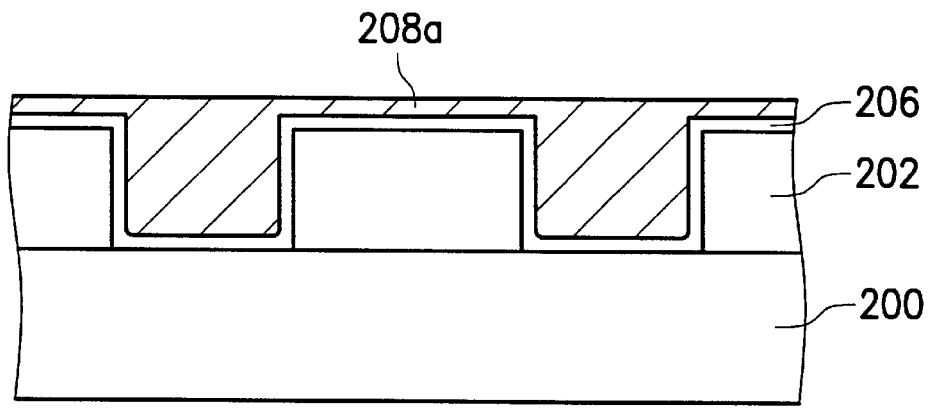

Referring now to FIG. 6, the copper layer 208 is partially polished back using a conventional chemical-mechanical polishing (CMP) process to remove most of the undesired copper. Conventional slurries used to polish copper are used at this step. Ideally, the barrier layer 206 is not etched at this step and remain covered by the remaining copper layer 208a.

Figure 7:
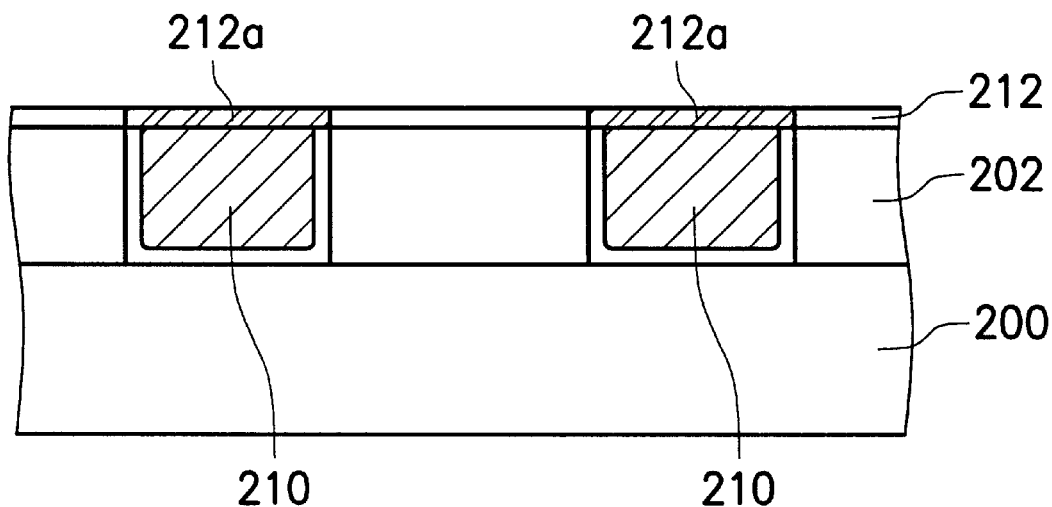

Next, referring to FIG. 7, the remaining copper layer 208a and the barrier layer 206 are polished down to the top surface of the first intermetal dielectric layer 202 to thereby define copper interconnects 210. According to an important feature of the invention, the slurry used at this step comprises an aluminum organic substance which can react with copper via annealing to form an aluminum-copper alloy.

Examples of such aluminum organic substances include aluminum acetate, aluminum ammonium sulfate, aluminum boroformate, aluminum cyclic borane, and the like.

Still referring to FIG. 7, the above polishing leaves a thin film 212 comprising the aluminum organic substance on the first intermetal dielectric layer 202 and the copper interconnects 210. The substrate is then subjected to annealing to selectively form aluminum-copper alloys 212a only on the surface of the copper interconnects 210. The annealing is preferably performed at a temperature ranging from about 350° C. to about 420° C. More preferably, the substrate is baked, prior to the annealing, at a temperature ranging from about 100° C. to about 150° C. to concentrate the aluminum organic substance on the copper interconnects.

Figure 8:
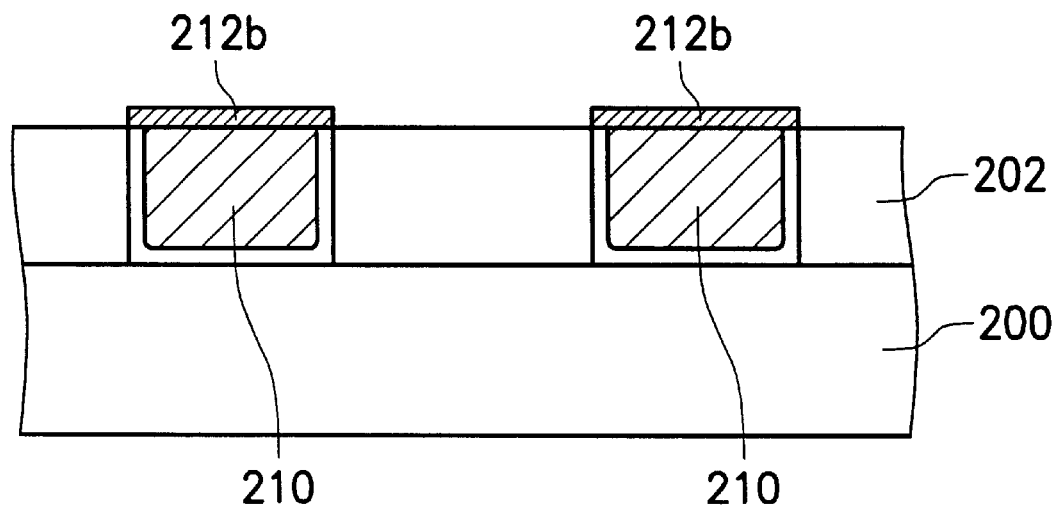
Figure 9:
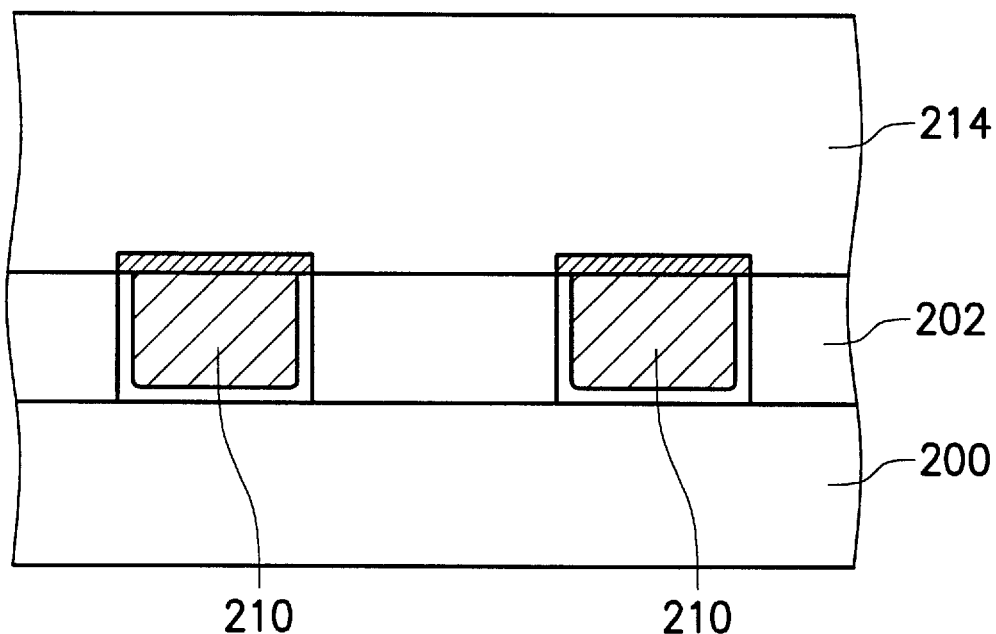

Referring to FIG. 8, another important feature of the invention is shown. The substrate is treated with an inorganic acid solution such as an aqueous solution of $H_3PO_4$, $HNO_3$, and the like. The inorganic acid solution, on one hand, selectively removes the non-reacted aluminum organic substance on the dielectric layer 202 and on the other hand, oxidizes the aluminum-copper alloys 212a on the copper interconnects 210 to form aluminum oxide. Thereby, the top surface of the dielectric layer 202 is exposed and aluminum oxide protection layers 212b is selective formed overlying the copper interconnects but not overlying the first intermetal dielectric layer 202.

According to the invention, the aluminum oxide layers 212b can function as a conventional sealing layer to prevent copper diffusion and oxidation. Therefore, referring to FIG. 9, a second intermetal dielectric layer 214 can be directly deposited on the aluminum oxide layers 212b and the first intermetal dielectric layer 202 without a conventional sealing layer of silicon nitride. Reliability problems due to the poor adhesion between the nitride and copper will be eliminated.

Figure 10:
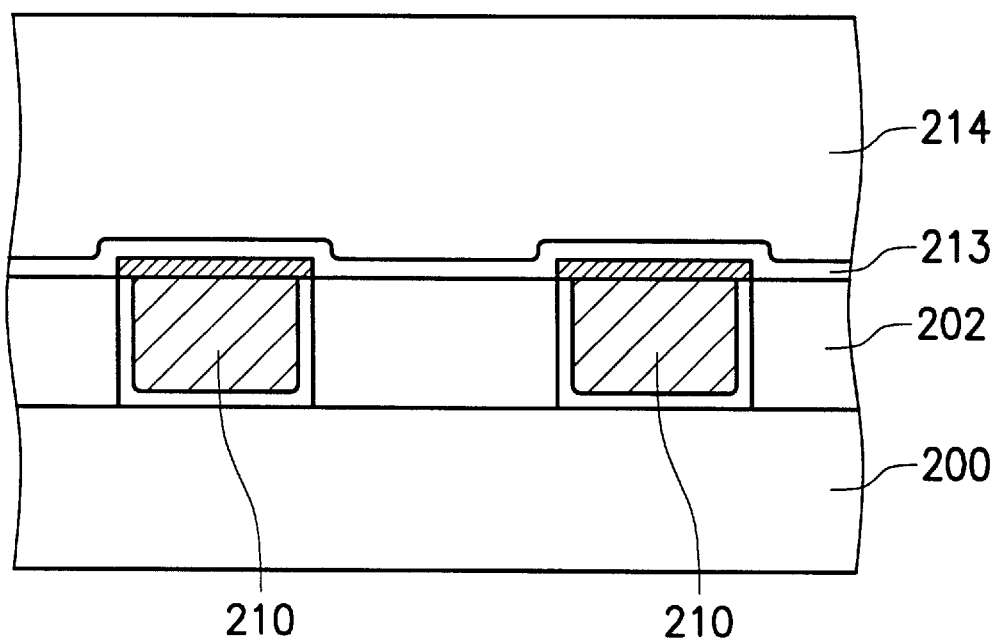

In another aspect of the invention, the aluminum oxide layers 212b can also function as an adhesion layer between a conventional sealing layer and the copper interconnects. Referring to FIG. 10, a blanket layer of silicon nitride 213 is deposited on the substrate surface before depositing the second intermetal dielectric 214. The aluminum oxide layers 212b improve adhesion, such that the silicon nitride layer 213 is less prone to peeling away from underlying copper interconnects. In addition, because the copper interconnects are already capped with the protection layers, the copper interconnects are less susceptible to oxidation during the subsequent processing.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for making copper interconnects in the fabrication of a semiconductor device, comprising the steps of:

providing a semiconductor substrate;

forming a dielectric layer overlying the substrate, the dielectric layer having interconnect trenches formed therein;

depositing a copper layer overlying the dielectric layer and filling the interconnect trenches;

chemical-mechanical polishing the copper layer to the top surface of the dielectric layer and thereby defining copper interconnects, said polishing leaving an aluminum organic substance on said copper interconnects which can react with copper via annealing to form an aluminum-copper alloy;

annealing the substrate to form aluminum-copper alloys overlying said copper interconnects; and oxidizing the aluminum-copper alloys to form aluminum oxide protection layers capping said copper interconnects.

2. The method as claimed in claim 1, wherein said dielectric layer has interconnect holes formed inside said interconnect trenches.

3. The method as claimed in claim 1, wherein the step of polishing comprises polishing the copper layer with a slurry comprising said aluminum organic substance.

4. The method as claimed in claim 1, wherein said aluminum organic substance is selected from the group consisting of aluminum acetate, aluminum ammonium sulfate, aluminum boroformate, and aluminum cyclic borane.

5. The method as claimed in claim 1, further comprising the step of baking the substrate, prior to annealing the substrate.

6. The method as claimed in claim 5, wherein said baking is performed at a temperature ranging from about 100° C. to about 150° C.

7. The method as claimed in claim 1, wherein said annealing is performed at a temperature ranging from about 350° C. to about 420° C.

8. The method as claimed in claim 1, wherein the step of oxidizing the aluminum-copper alloys comprises treating the aluminum-copper alloys with an inorganic acid solution.

9. The method as claimed in claim 8, wherein said inorganic acid solution comprises $H_3PO_4$.

10. The method as claimed in claim 8, wherein said inorganic acid solution comprises $HNO_3$.

11. A method for making copper interconnects in the fabrication of a semiconductor device, comprising the steps of:

providing a semiconductor substrate;

forming a dielectric layer overlying the substrate, the dielectric layer having interconnect trenches formed therein;

depositing a copper layer overlying the dielectric layer and filling the interconnect trenches;

first chemical-mechanical polishing the copper layer with a first slurry to remove most of the copper layer overlying the dielectric layer;

second chemical-mechanical polishing the copper layer with a second slurry to the top surface of the dielectric layer and thereby defining copper interconnects, said second slurry comprising an aluminum organic substance which can react with copper via annealing to form an aluminum-copper alloy, and said polishing leaving said aluminum organic substance on said dielectric layer and said copper interconnects;

annealing the substrate to form aluminum-copper alloys overlying said copper interconnects; and treating the substrate with an inorganic acid solution to selectively remove non-reacted aluminum organic substance from said dielectric layer and to oxidize the aluminum-copper alloys to form aluminum oxide protection layers capping said copper interconnects.

12. The method as claimed in claim 11, wherein said dielectric layer has interconnect holes formed inside said interconnect trenches.

13. The method as claimed in claim 11, wherein said aluminum organic substance is selected from the group consisting of aluminum acetate, aluminum ammonium sulfate, aluminum boroformate, and aluminum cyclic borane.

14. The method as claimed in claim 11, further comprising the step of baking the substrate, prior to annealing the substrate.

15. The method as claimed in claim 14, wherein said baking is performed at a temperature ranging from about 100° C. to about 150° C.

16. The method as claimed in claim 11, wherein said annealing is performed at a temperature ranging from about 350° C. to about 420° C.

17. The method as claimed in claim 11, wherein said inorganic acid solution comprises $H_3PO_4$.

18. The method as claimed in claim 11, wherein said inorganic acid solution comprises $HNO_3$.

19. The method as claimed in claim 11, further comprising forming an intermetal dielectric layer overlying the protection layers and the dielectric layer.

20. The method as claimed in claim 11, further comprising forming a sealing layer overlying the protection layers and the dielectric layer, and forming an intermetal dielectric layer overlying the sealing layer.

21. A method for making copper interconnects in the fabrication of a semiconductor device, comprising the steps of:

providing a semiconductor substrate;

forming a dielectric layer overlying the substrate, the dielectric layer having interconnect trenches formed therein;

depositing a barrier layer lining said interconnect trenches and overlying said dielectric layer;

depositing a copper layer overlying the barrier layer and filling the interconnect trenches;

first chemical-mechanical polishing the copper layer with a first slurry to remove most of the copper layer overlying the dielectric layer;

second chemical-mechanical polishing the copper layer and the barrier layer with a second slurry to the top surface of the dielectric layer and thereby defining copper interconnects, said second slurry comprising an aluminum organic substance which can react with copper via annealing to form an aluminum-copper alloy, and said polishing leaving said aluminum organic substance on said dielectric layer and said copper interconnects;

baking the substrate at a first temperature;

annealing the substrate at a second temperature higher than the first temperature to form aluminum-copper alloys capping said copper interconnects; and treating the substrate with an inorganic acid solution to selectively remove non-reacted aluminum organic substance from said dielectric layer and to oxidize the aluminum-copper alloys to form aluminum oxide cap layers overlying said copper interconnects.

22. The method as claimed in claim 21, wherein said dielectric layer has interconnect holes formed inside said interconnect trenches.

23. The method as claimed in claim 21, wherein said aluminum organic substance is selected from the group consisting of aluminum acetate, aluminum ammonium sulfate, aluminum boroformate, and aluminum cyclic borane.

24. The method as claimed in claim 21, wherein said baking is performed at a temperature ranging from about 100° C. to about 150° C.

25. The method as claimed in claim 21, wherein said annealing is performed at a temperature ranging from about 350° C. to about 420° C.

26. The method as claimed in claim 21, wherein said inorganic acid solution comprises $H_3PO_4$.

27. The method as claimed in claim 21, wherein said inorganic acid solution comprises $HNO_3$.

28. The method as claimed in claim 21, further comprising forming an intermetal dielectric layer overlying the protection layers and the dielectric layer.

29. The method as claimed in claim 21, further comprising forming a sealing layer overlying the protection layers and the dielectric layer, and forming an intermetal dielectric layer overlying the sealing layer.

30. The method as claimed in claim 29, wherein said sealing layer is formed of silicon nitride.

31. The method as claimed in claim 21, wherein said barrier layer is selected from the group consisting of Ti, TiN, Ta, TaN, W, and WN.

* * * * *